(12) United States Patent
Yagishita et al.

(10) Patent No.: US 6,607,952 B1
(45) Date of Patent: Aug. 19, 2003

(54) SEMICONDUCTOR DEVICE WITH A DISPOSABLE GATE AND METHOD OF MANUFACTURING THE SAME

(75) Inventors: Atsushi Yagishita, Yokohama (JP); Kazuaki Nakajima, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 130 days.

(21) Appl. No.: 09/609,109

(22) Filed: Jun. 30, 2000

(30) Foreign Application Priority Data

Jun. 30, 1999 (JP) .......................................... 11-186988

(51) Int. Cl.$^7$ .......................................... H04L 21/8238
(52) U.S. Cl. ........................ 438/216; 438/300; 438/422
(58) Field of Search ................................ 438/216, 183, 438/306, 422, 595, 305, 300; 257/410, 900

(56) References Cited

U.S. PATENT DOCUMENTS

| | | | | |
|---|---|---|---|---|
| 6,127,711 A | * | 10/2000 | Ono | 257/410 |
| 6,180,978 B1 | * | 1/2001 | Chatterjee et al. | 257/327 |
| 6,232,188 B1 | * | 5/2001 | Murtaza et al. | 438/300 |
| 6,232,641 B1 | * | 5/2001 | Miyano et al. | 257/382 |

FOREIGN PATENT DOCUMENTS

| | | | | |
|---|---|---|---|---|
| GB | 2347789 A | * | 9/2000 | H01L/27/092 |
| JP | 11-074527 A | | 3/1999 | |

* cited by examiner

*Primary Examiner*—Long Pham
*Assistant Examiner*—(Vikki) Hoa B. Trinh
(74) *Attorney, Agent, or Firm*—Finnegan, Henderson, Farabow, Garrett & Dunner, L.L.P.

(57) ABSTRACT

A method of manufacturing a semiconductor device, includes the steps of forming a disposable gate on a semiconductor substrate in a region where a gate electrode is to be formed, forming a sidewall spacer on a sidewall of the disposable gate, forming a source and drain in the semiconductor substrate using the disposable gate and the sidewall spacer as a mask, forming an interlevel insulating film on the semiconductor substrate so as to cover the disposable gate, planarizing an upper surface of the interlevel insulating film to expose upper surfaces of the disposable gate and the sidewall spacer, removing the disposable gate to form a trench portion having a side surface formed from the sidewall spacer and a bottom surface formed from the semiconductor substrate, depositing a gate insulating film on the semiconductor substrate so as to cover the bottom surface and side surface of the trench portion, forming a gate electrode buried in the trench portion, and removing the sidewall spacer and the gate insulating film on the sidewall of the gate electrode.

3 Claims, 12 Drawing Sheets

SEMICONDUCTOR DEVICE WITH A DISPOSABLE GATE AND METHOD OF MANUFACTURING THE SAME

CROSS-REFERENCE TO RELATED APPLICATIONS

This application is based upon and claims the benefit of priority from the prior Japanese Patent Application No. 11-186988, filed Jun. 30, 1999, the entire contents of which are incorporated herein by reference.

BACKGROUND OF THE INVENTION

The present invention relates to a method of manufacturing a semiconductor device including a MISFET formed by burying a gate electrode in a trench.

In recent years, strong demand has arisen for increasing the integration degree and speed of semiconductor devices. To meet this demand, the size between elements and element size have been reduced to attain shrink in feature sizes while reduction of resistance of internal interconnection materials and reduction of parasitic capacitance have been examined.

Especially, a great challenge for a gate electrode having a conspicuous RC delay is to attain a low resistance. Recently, to reduce the resistance of a gate electrode, a polycide gate having a two-layered structure comprised of a polysilicon film and metal silicide film is widely employed. A refractory metal silicide film has a resistance lower than that of a polysilicon film by about one order of magnitude and therefore is a promising low-resistance interconnection material. As a silicide, tungsten silicide ($WSi_x$) has been most widely used for a long time.

However, to cope with a thin interconnection having a size of 0.15 μm or less, the interconnection resistance need be further reduced to shorten the delay time. To realize a gate electrode having a low resistance corresponding to a sheet resistance of 1Ω/□ or less using tungsten silicide, the film thickness of the silicide layer must be increased. This makes it difficult to fabricate the gate electrode pattern or form an interlevel insulating film on the electrode. To avoid this, it is required to achieve a low sheet resistance without increasing the aspect ratio of the electrode.

Under these circumstances, a so-called metal gate structure in which a metal film is directly stacked on a gate insulating film without interposing a polysilicon film is promising. However, unlike the conventional gate electrode, this structure has disadvantages such as difficulty in gate electrode fabrication and poor heat resistance.

To avoid the above-described problems, a trench-buried-type gate electrode forming method has been proposed. More specifically, after a disposable gate electrode pattern is formed, a diffusion layer is formed via the disposable gate. Then, a gate sidewall insulating film and interlevel insulating film are formed around the disposable gate. The disposable gate is peeled to form a trench, and a metal material for forming a gate electrode is buried in this trench. When this technique is used, the annealing temperature after metal gate electrode formation can be made low.

However, when a gate insulating film is formed by deposition, the insulating film is deposited not only on the bottom surface of the trench but also on the side surface. Especially, when a high-dielectric constant film is used as a gate insulating film, the high-dielectric constant material is also deposited on the gate sidewall.

The insulating film on the gate electrode sidewall is reflected not only in the interconnection capacitance between the gate electrode and an adjacent interconnection but also in the capacitances between the gate electrode and the contact for connecting the source/drain region to an upper interconnection and between the source or drain and the gate electrode. That is, when an insulating film with high dielectric constant is used on the gate electrode sidewall, the parasitic capacitance of the interconnection increases to reduce the operation speed of the circuit.

BRIEF SUMMARY OF THE INVENTION

It is an object of the present invention to provide a method of manufacturing a semiconductor device in which an insulating film having a dielectric constant lower than that of the gate electrode is self-aligned to the sidewall of the gate electrode of a MISFET having a buried gate electrode to reduce the parasitic capacitance and suppress a decrease in circuit operation speed.

In order to achieve the above object, the present invention has the following arrangements.

According to the present invention, there is provided a semiconductor device comprising a source and drain formed in a semiconductor substrate, a crystallized gate insulating film formed on the semiconductor substrate in a region between the source and drain, a gate electrode formed on the gate insulating film, and an insulating film formed on a side surface of the gate electrode and having an amorphous structure formed from the same material as that of the gate insulating film.

The gate insulating film and the insulating film are preferably formed from a material selected from the group consisting of cerium oxide ($CeO_2$), zirconium oxide ($ZrO_2$), hafnium oxide ($HfO_2$), thorium oxide ($ThO_2$), yttrium oxide ($Y_2O_3$), calcium fluoride ($CaF_2$), tin-calcium fluoride ($CaSnF_2$), titanium-barium oxide ($BaTiO_3$), and $La_2O_3$.

According to the present invention, there is also provided a method of manufacturing a semiconductor device, comprising the steps of forming a disposable gate on a semiconductor substrate in a region where a gate electrode is to be formed, forming a sidewall spacer on a sidewall of the disposable gate, forming a source and drain in the semiconductor substrate using the disposable gate and the sidewall spacer as a mask, forming an interlevel insulating film on the semiconductor substrate so as to cover the disposable gate, planarizing an upper surface of the interlevel insulating film to expose upper surfaces of the disposable gate and the sidewall spacer, removing the disposable gate to form a trench portion having a side surface formed from the sidewall spacer and a bottom surface formed from the semiconductor substrate, depositing a gate insulating film on the semiconductor substrate so as to cover the bottom surface and side surface of the trench portion, forming a gate electrode buried in the trench portion, and removing the sidewall spacer and the gate insulating film on the sidewall of the gate electrode.

(a) A low-dielectric constant insulating film having a dielectric constant lower than that of a thermal oxide film of silicon is preferably buried in a trench formed by removing the sidewall spacer and the gate insulating film.

(b) The low-dielectric constant insulating film is preferably formed from a material selected from the group consisting of $SiO_2$, SiOF, Fluorinated Amorphous Carbon, Parylene F, Parylene N, Polynaphthalene, Hydrogen Silsesquioxane, Spin-On-Glass, Aerogel/Xerogel, Fluorinated Polyimide, Teflon, Benzocyclobutene, Polyaryl Ether, Fluorinated Polyaryl Ether, and Air gap.

According to the present invention, there is also provided a method of manufacturing a semiconductor device, comprising the steps of forming a disposable gate on a semiconductor substrate in a region where a gate electrode is to be formed, forming a sidewall spacer on a sidewall of the disposable gate, forming a source and drain in the semiconductor substrate using the disposable gate and the sidewall spacer as a mask, forming an interlevel insulating film on the semiconductor substrate so as to cover the disposable gate, planarizing an upper surface of the interlevel insulating film to expose upper surfaces of the disposable gate and the sidewall spacer, removing the disposable gate to form a trench portion having a side surface formed from the sidewall spacer and a bottom surface formed from the semiconductor substrate, depositing an insulating film having an amorphous structure on the semiconductor substrate so as to cover the semiconductor substrate on the bottom surface of the trench portion, epitaxially growing an insulating film having a single-crystal structure from the insulating film having the amorphous structure on the bottom surface of the trench portion to form a gate insulating film on the bottom surface of the trench, depositing a gate electrode material on the semiconductor substrate so as to bury the trench portion, and removing the gate electrode material on the interlevel insulating film and the insulating film having the amorphous structure to form a gate electrode buried in the trench portion.

(a) Before deposition of the gate electrode material, the insulating film having the amorphous structure on the side surface of the trench portion is preferably removed by etching.

(b) Before deposition of the gate electrode material, the insulating film having the amorphous structure on the side surface of the trench portion is preferably modified to form a conductor.

($b_1$) The insulating film is formed from an $HfO_2$ film, and the insulating film is nitrided to form HfN as the conductor.

The present invention with the above arrangements has the following functions and effects.

Since no high-dielectric constant gate insulating film is formed on the sidewall of the gate electrode, the parasitic capacitance between the gate electrode and the source/drain can be decreased to increase the operation speed of the circuit.

When a low-dielectric constant film having a dielectric constant lower than that of the thermal oxide film of silicon is buried in the trench formed by removing the gate insulating film from the gate electrode sidewall, the parasitic capacitance between the gate electrode and the source/drain can be further decreased to increase the operation speed of the circuit.

When the insulating film having the amorphous structure is removed, the parasitic capacitance between the gate electrode and the source/drain can be further decreased to increase the operation speed of the circuit.

When the insulating film having the amorphous structure is modified into a conductor before deposition of the gate electrode material, the parasitic capacitance between the gate electrode and the source/drain can be further decreased to increase the operation speed of the circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the accompanying drawings.

First Embodiment

Figure 1:
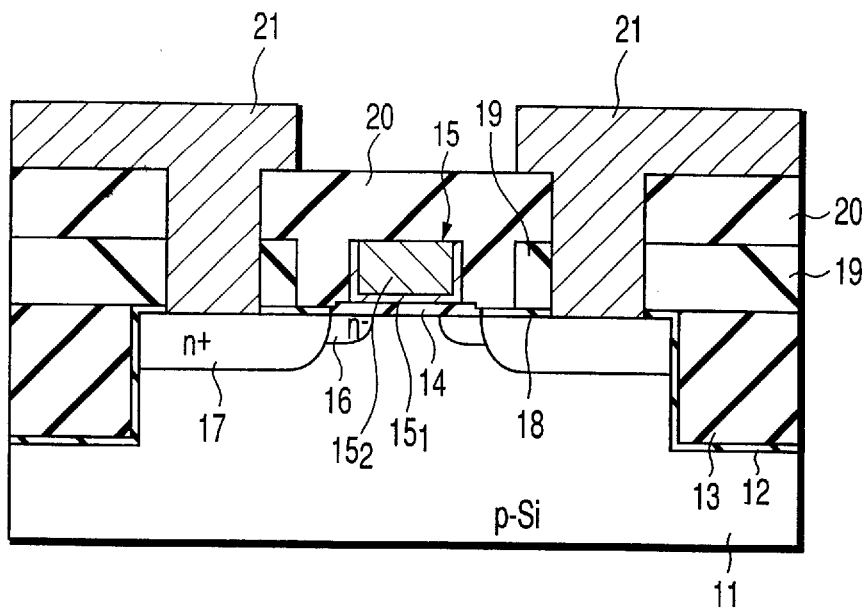
FIG. 1 is a sectional view showing the structure of a MISFET according to the first embodiment of the present invention.

FIG. 1 is a sectional view showing the structure of a MISFET according to the first embodiment of the present invention.

As shown in FIG. 1, a trench is formed in a p-type Si substrate 11 to surround the element region. An element isolation insulating film 13 is buried in this trench via a buffer oxide film 12.

A metal gate electrode 15 is formed in the element region on the Si substrate 11 via a $Ta_2O_5$ gate insulating film 14. The metal gate electrode 15 is comprised of an Al electrode $15_2$ and a TiN (barrier metal) $15_1$ as a barrier layer formed on the sidewall and bottom surface of the Al electrode.

An n⁻-type source and drain 16 are formed on the Si substrate 11 so as to sandwich the metal gate electrode 15. An n⁺-type source and drain 17 are so formed as to sandwich the metal gate electrode 15 and n⁻-type source and drain 16.

A TEOS-based silicon oxide film 19 is formed on the element isolation insulating film 13 and n⁺-type source and drain 17 via a buffer oxide film 18. A low-dielectric constant insulating film 20 having dielectric constant lower than that of a silicon thermal oxide film is formed on the TEOS-based silicon oxide film 19 and gate electrode 15 and via the buffer oxide film 18 on the Si substrate 11 where the TEOS-based silicon oxide film 19 is not formed. Contact holes connected to the n⁺-type source and drain 17 are formed in the TEOS-based silicon oxide film 19 and low-dielectric constant insulating film 20. Al interconnections 21 are formed in the contact holes.

As a characteristic feature of this device, the $Ta_2O_5$ gate insulating film 14 is present only in the region immediately under the metal gate electrode 15. As another characteristic feature, the sidewall and upper surface of the metal gate electrode 15 are covered with the low-dielectric constant insulating film (Low-k film) 20.

Figure 2A:
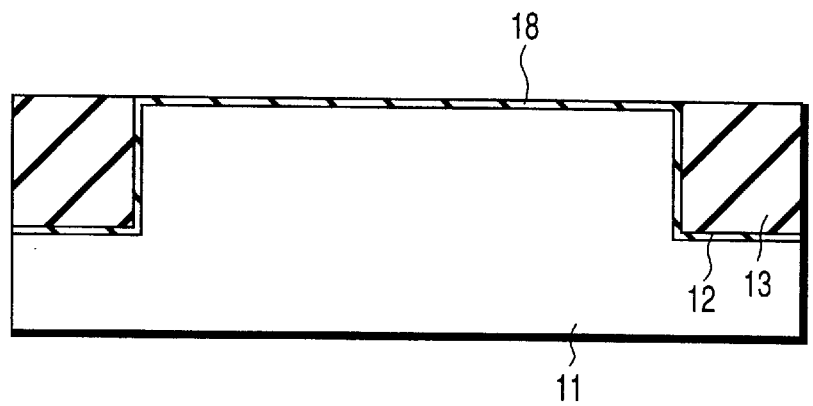
FIGS. 2A to 2O are sectional views showing the steps in manufacturing the MISFET according to the first embodiment of the present invention.

The process of manufacturing this MOSFET will be described next with reference to FIGS. 2A to 2O. FIGS. 2A to 2O are sectional views showing the steps in manufacturing the MISFET according to the first embodiment of the present invention.

First, as shown in FIG. 2A, a 200-nm deep trench is formed in the element isolation region surface of the Si substrate 11 with, e.g., a plane orientation of (100). The inner surface of the trench is thinly oxidized to form the buffer oxide film 12. For example, a TEOS-based silicon oxide film is deposited on the entire surface and planarized by CMP to bury the insulating film in the trench, thereby forming the element isolation insulating film 13 having an STI (Shallow Trench Isolation) structure. Ion implantation for well or channel formation is performed if necessary.

The 6-nm thick buffer oxide film 18 is formed on the substrate surface.

Figure 2B:
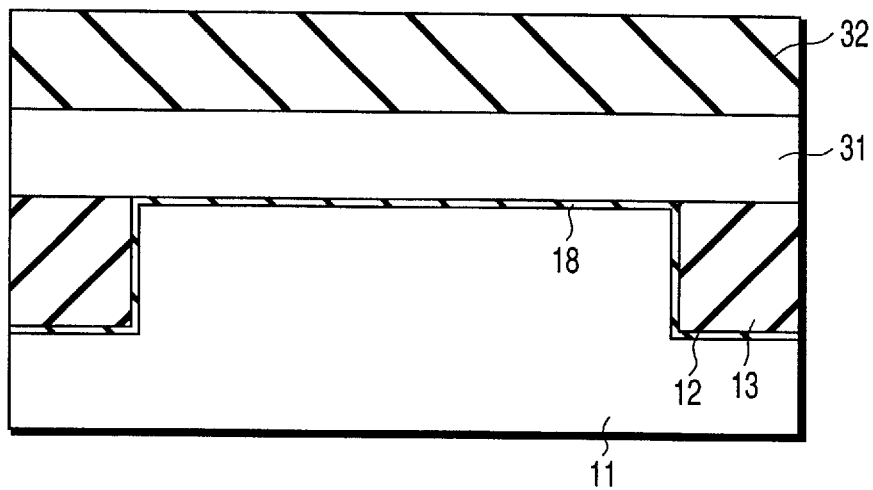

As shown in FIG. 2B, a polysilicon film 31 and silicon nitride film 32 each having a thickness of 150 nm are deposited by LPCVD as disposable gate materials.

Figure 2C:
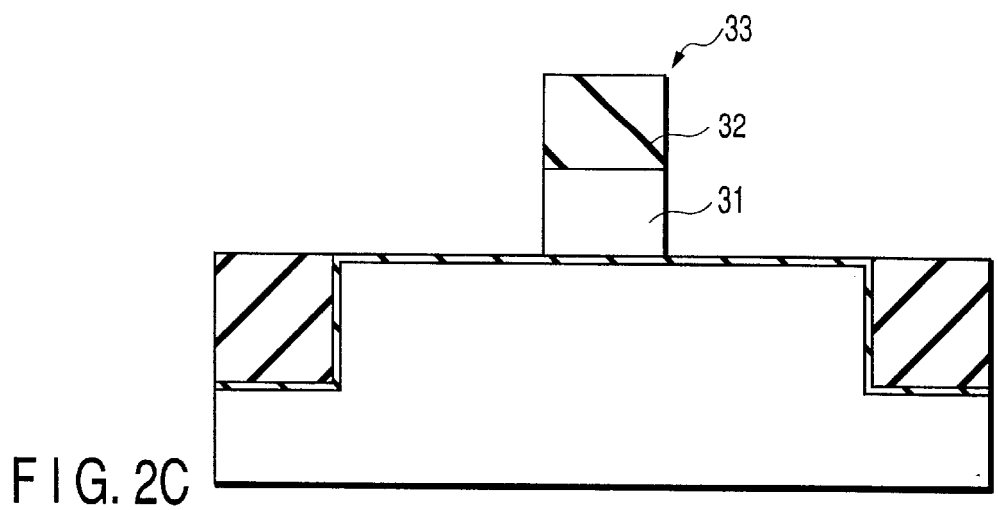

As shown in FIG. 2C, a resist pattern (not shown) is formed in a prospective gate formation region by photolithography or EB drawing. The silicon nitride film 32 and polysilicon film 31 outside the prospective gate formation region are removed by RIE to form a disposable gate 33. Then, the resist pattern is removed.

Figure 2D:
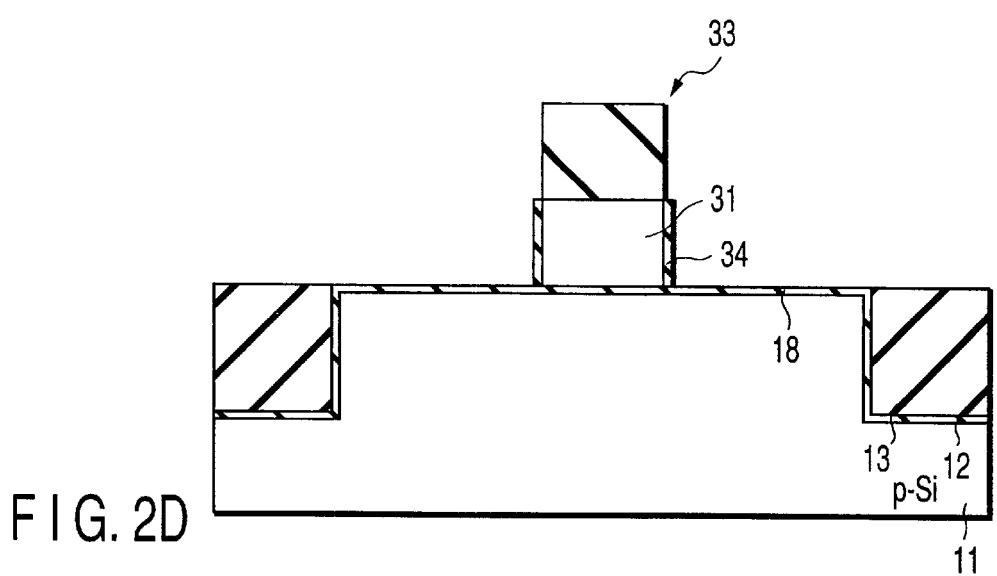
Figure 2E:
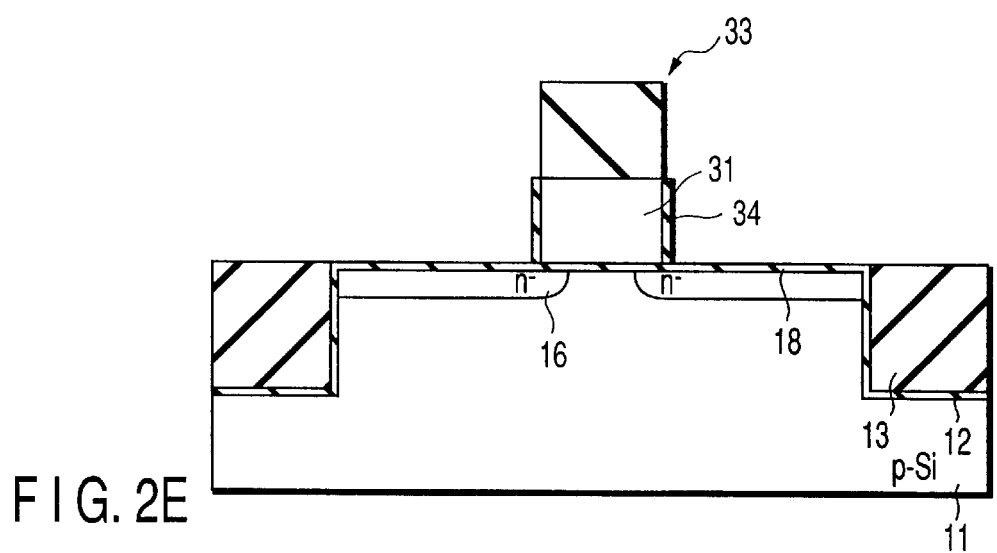

As shown in FIG. 2D, a 6-nm thick oxide film 34 is formed on the side surface of the polysilicon film 31 by thermal oxidation. As shown in FIG. 2E, ions are implanted using the disposable gate 33 as a mask to form the n⁻-type source and drain 16. In this ion implantation, for example, As ions are implanted at an acceleration voltage of 15 keV and dose of $3 \times 10^{14}$ cm⁻². To form a CMOS, n⁺- and p⁺-type diffusion layers are selectively formed using a mask formed by lithography.

Figure 2F:
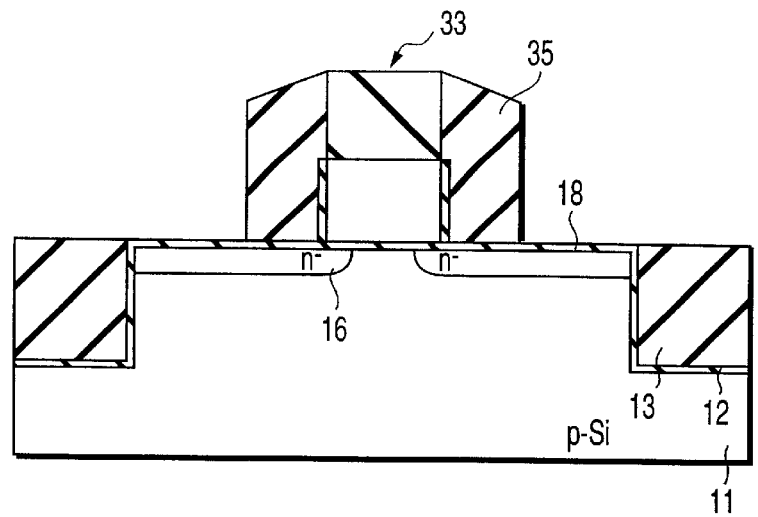

As shown in FIG. 2F, a 70-nm thick silicon nitride film is deposited, and its entire surface is subjected to RIE to leave the silicon nitride film only on the side surface of the disposable gate 33, thereby forming a sidewall spacer 35.

Figure 2G:
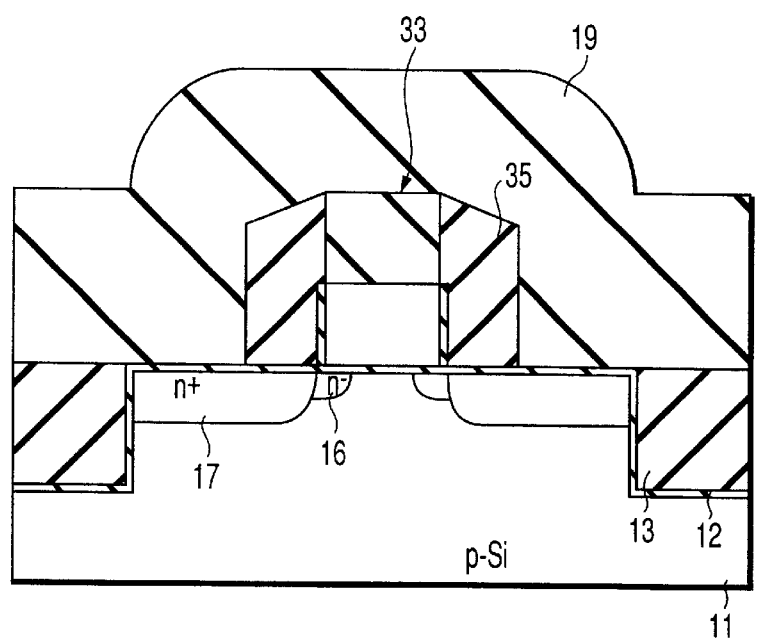

As shown in FIG. 2G, ions are implanted to form the n⁺-type source and drain 17 at a concentration higher than that of the n⁻-type source and drain 16. In this ion implantation, for example, As ions are implanted at an acceleration voltage of 45 keV and dose of $3 \times 10^{15}$ cm⁻². To form a CMOS, n⁺- and p⁺-type diffusion layers are selectively formed using a mask formed by lithography. Activation annealing (e.g., RTA at 1,000° C. for 10 sec) of the source and drain diffusion layers may be performed every time immediately after ion implantation or performed at once after all ion implantation processes are complete. The 350-nm thick TEOS-based silicon oxide film 19 is deposited on the entire surface by LPCVD.

Figure 2H:
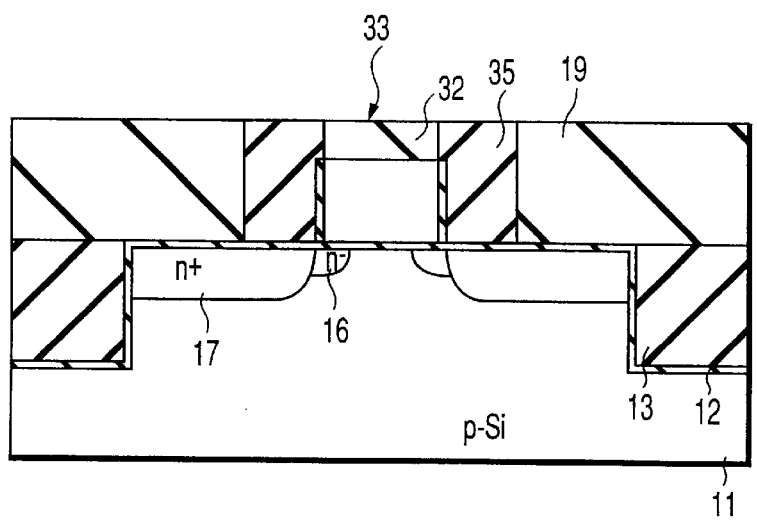

As shown in FIG. 2H, the TEOS-based silicon oxide film 19 is etched back and planarized by CMP (Chemical Mechanical Polishing). In this CMP process, the silicon nitride films 32 and 35 serve as a CMP stopper.

Figure 2I:
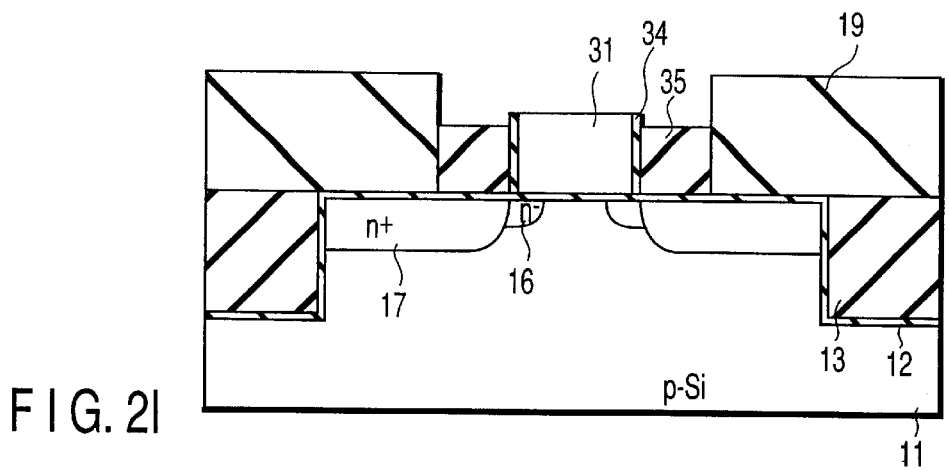

As shown in FIG. 2I, the silicon nitride film 32 of the disposable gate 33 is removed by wet etching using hot phosphoric acid. In this etching process, since the upper portion of the sidewall spacer 35 formed from a silicon nitride film is also etched, the height of the sidewall spacer 35 slightly decreases.

Figure 2J:
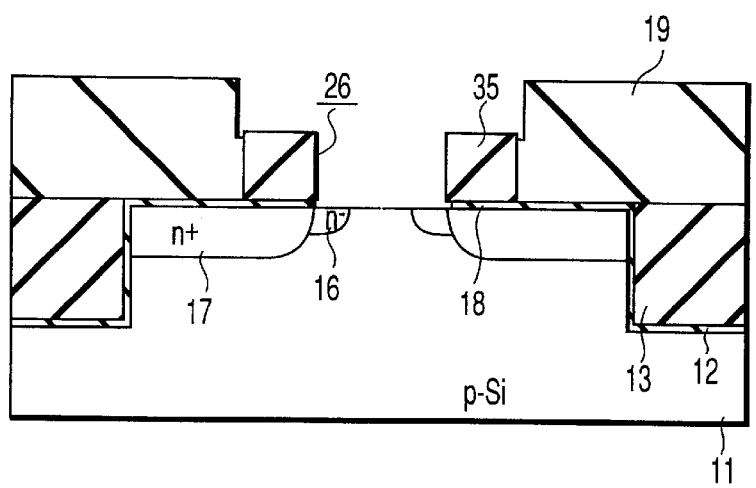

As shown in FIG. 2J, the polysilicon film 31 of the disposable gate 33 is removed by CDE, and the buffer oxide film 18 is removed by wet etching using HF, thereby forming a trench portion 26 in the prospective gate electrode formation region. Channel ions may be independently implanted in the NMOS and PMOS channel regions using lithography.

Figure 2K:
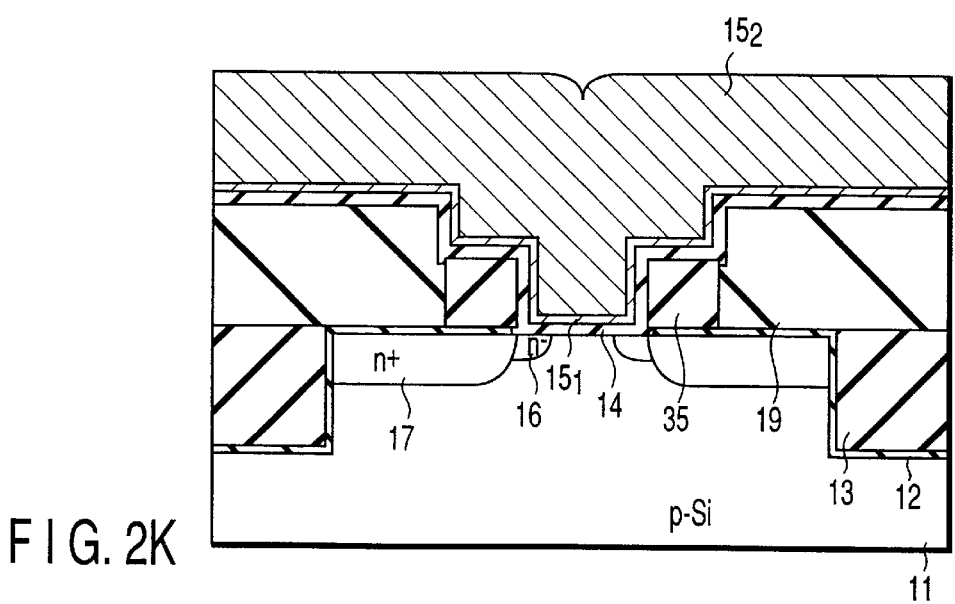

As shown in FIG. 2K, the $Ta_2O_5$ gate insulating film 14 is formed on the entire surface. The method of forming the $Ta_2O_5$ gate insulating film 14 will be described below. The surface of the Si substrate 11 is irradiated with oxygen radicals to form a 0.2- to 0.3-nm thick $SiO_2$ layer. Subsequently, an $Si_3N_4$ layer having an oxide film conversion thickness of 0.6 nm (actual thickness: 1.2 nm) is deposited using ammonia and silane. A $Ta_2O_5$ film having an oxide film conversion thickness of 1 nm (actual thickness: 5 nm) is formed on the $Si_3N_4$ layer by CVD. With this process, a gate insulating film having an oxide film conversion thickness of 2 nm or less is formed.

As another method of forming the $Ta_2O_5$ gate insulating film 14, a 1-nm thick $SiO_2$ layer may be formed by thermal oxidation, and the surface thereof may be nitrided ($N_2$ plasma nitriding) at a low temperature (600° C. or less) using nitrogen radicals. When an $Si_3N_4$ film having an oxide film conversion thickness of 0.6 nm (actual thickness: 1.2 nm) is formed, the $SiO_2$ layer has a thickness of 0.4 nm. When a $Ta_2O_5$ film having an oxide film conversion thickness of 1 nm (actual thickness: 5 nm) is formed on the $SiO_2$ layer by CVD, the $Ta_2O_5$ gate insulating film 14 has an oxide film conversion thickness of 2 nm or less.

As a gate electrode, the 10-nm thick TiN $15_1$ and 250-nm thick Al electrode $15_2$ are deposited.

Figure 2L:
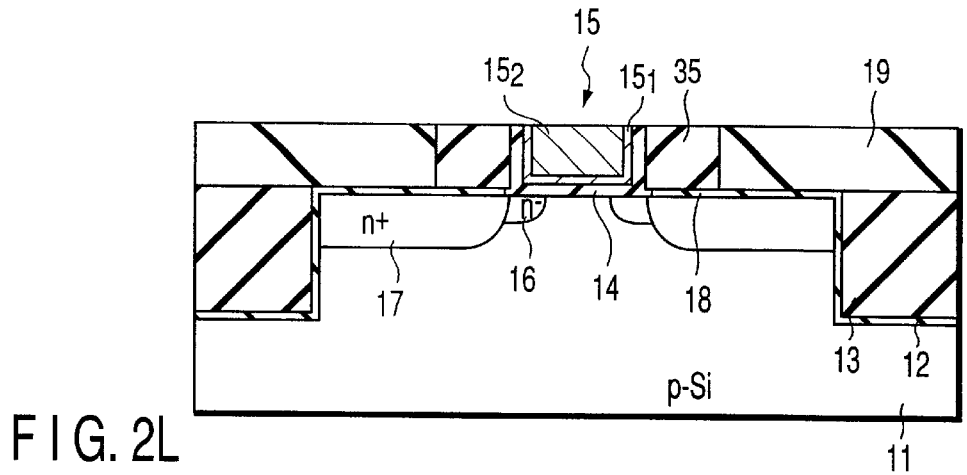

As shown in FIG. 2L, etching back and planarization are performed by CMP using the sidewall spacer 35 as a stopper to form the $Ta_2O_5$ gate insulating film 14 and gate electrode 15 buried in the trench portion 26.

Since the sources and drains 16 and 17 are already formed (including activation), and high-temperature process at 450° C. or more is basically no longer present, a metal material (Al, W, TiN, or Ru) can be used as the gate electrode. In addition, a high-dielectric constant film (high-k film: $Ta_2O_5$, $TiO_2$, $Si_3N_4$, $HfO_2$, $ZrO_2$, $La_2O_3$, $Gd_2O_3$, $Y_2O_3$, $CaF_2$, $CaSnF_2$, $CeO_2$, Yttria Stabilized Zirconia, $Al_2O_3$, $ZrSiO_4$, $HfSiO_4$, $Gd_2SiO_5$, or $2La_2O_3 \cdot 3SiO_2$) or ferroelectric film (e.g., $(Ba, Sr)TiO_3$) can be used as the gate insulating film.

Figure 2M:
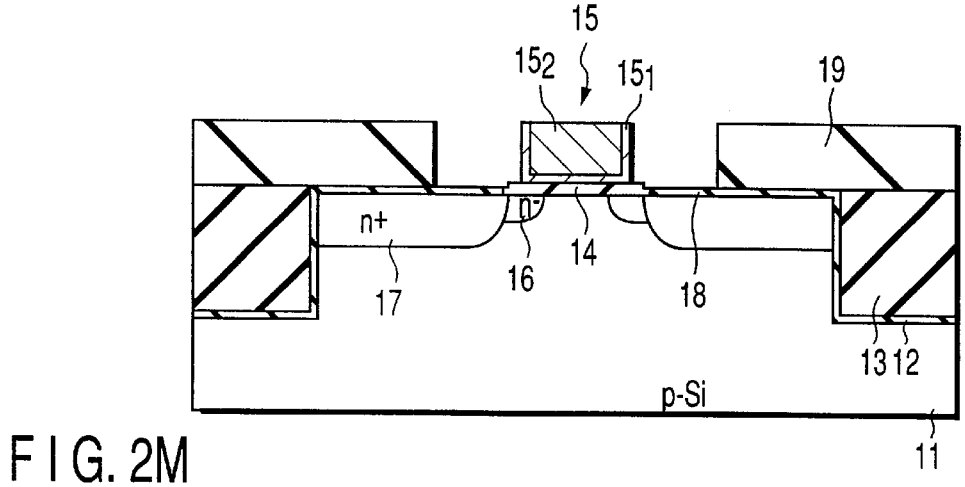

As shown in FIG. 2M, the $Ta_2O_5$ gate insulating film 14 on the TEOS-based silicon oxide film 19, which is hardly removed by CMP and readily remains, is removed by CDE using $CF_4$ and $O_2$ gas, and the $Ta_2O_5$ gate insulating film 14 and sidewall spacer 35 on the side surface of the metal gate electrode 15 are also removed. The $Ta_2O_5$ gate insulating film 14 is present only immediately under the metal gate electrode 15 and not on the side surface of the metal gate electrode 15 and on the TEOS-based silicon oxide film 19.

Generally, a buffer layer formed from a thermal oxide film or oxynitride film is formed under a high-dielectric constant film or ferroelectric film to improve the interface characteristics. This buffer layer serves as an etching stopper in removing the $Ta_2O_5$ insulating film 14 and sidewall spacer 35, thereby preventing the Si substrate 11 from being etched.

Assume that the $Ta_2O_5$ film is formed using $Ta(OC_2H_5)_5$ as a source gas under optimum film formation process conditions. On TEOS or silicon nitride film, the $Ta_2O_5$ film is grown in an island shape to realize a sparse film quality. On a silicon substrate or thin thermal oxide film (like the portion under the metal gate in this embodiment), a dense and uniform film quality can be obtained. Hence, it is relatively easy to selectively remove only the $Ta_2O_5$ insulating film 14 on the TEOS-based silicon oxide film 19 and the sidewall of the metal gate electrode 15 and leave the $Ta_2O_5$ insulating film 14 under the metal gate electrode 15.

Figure 2N:
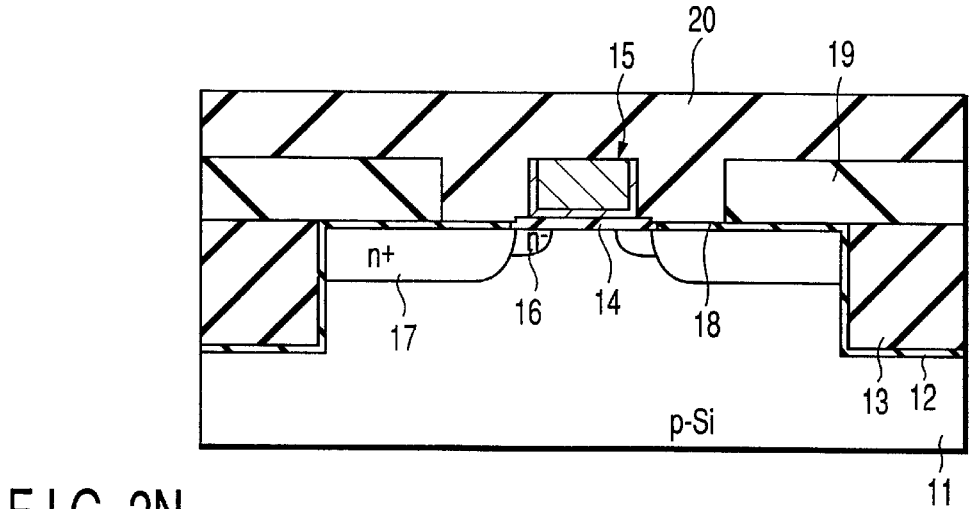
Figure 20:
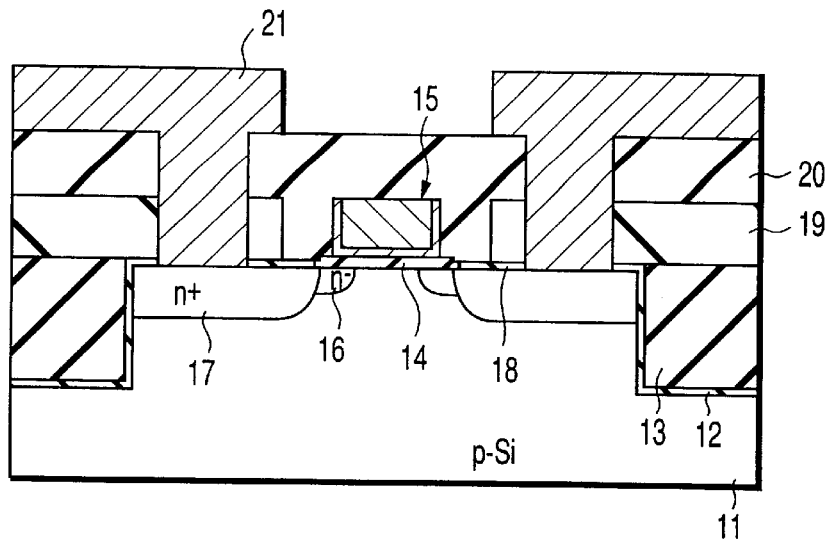

As shown in FIG. 2N, the low-dielectric constant insulating film (e.g., the dielectric constant: 2.5) 20 is deposited so as to cover the side and upper surfaces of the metal gate electrode 15. As shown in FIG. 2O, contact holes to be connected to the $n^+$-type source and drain 17 are formed in the low-dielectric constant insulating film 20 and TEOS-based silicon oxide film 19, and then, the Al interconnection 21 as an upper interconnection layer connected to the $n^+$-type source and drain 17 is formed.

As described above, in the MISFET formed by the present invention, the $Ta_2O_5$ gate insulating film having a high dielectric constant is not formed on the sidewall of the metal gate electrode 15, and a low-dielectric constant film is formed on the sidewall of the metal gate electrode. For this reason, the interconnection capacitance between the gate electrode 15 and the sources and drains 16 and 17 decreases to improve the element operation speed. In addition, since the $Ta_2O_5$ gate insulating film 14 is present only in the region under the gate electrode 15, the $Ta_2O_5$ does not stop contact RIE. That is, contact holes in the source and drain regions can easily be formed. Furthermore, since the high-dielectric constant film on the sidewall of the gate electrode 15 is removed, a transistor design suitable for shrink in feature size and improvement in degree of integration can be obtained.

As the low-dielectric constant insulating film, materials shown in Table 1 can be used.

TABLE 1

| Material | k | Tg (° C.) | Film formation method |
|---|---|---|---|
| $SiO_2$ | 4.0–4.5 | >450 | PECVD |
| SiOF | 3.5–3.8 | >450 | PECVD |
| Fluorinated Amorphous Carbon | 2.3 | >450 | PECVD |
| Parylene F | 2.3–2.6 | 248 (530*:) | LPCVD |
| Parylene N | 2.7 | (420*: 5% Wt loss) | LPCVD |
| Polynaphthalne | 2.3 | 590 | LPCVD |

TABLE 1-continued

| Material | k | Tg (° C.) | Film formation method |
|---|---|---|---|
| Hydrogen Silsesquioxane | 2.7–3.1 | >450 | LPCVD |
| Spin-On-Glass | 2.7–4.0 | >450 | Spin Coat |
| Aerogel/Xerogel | 1.3–2.0 | >450 | Spin Coat |
| Fluorinated Polyimide | 2.3–2.8 | 400–425 | Spin Coat |
| Teflon | 1.9 | <300 | Spin Coat |
| Benzocycrobutene | 2.6 | >350 | Spin Coat |
| Polyaryl Ether | 2.77–2.94 | 275–290 | Spin Coat |
| Florinated Polyaryl Ether | 2.59–2.8 | 400 | Spin Coat |
| Airgap | 1.0 | >450 | |

In Table 1, k represents a permittivity, and $T_g$ represents a growth temperature.

Second Embodiment

Figure 3:
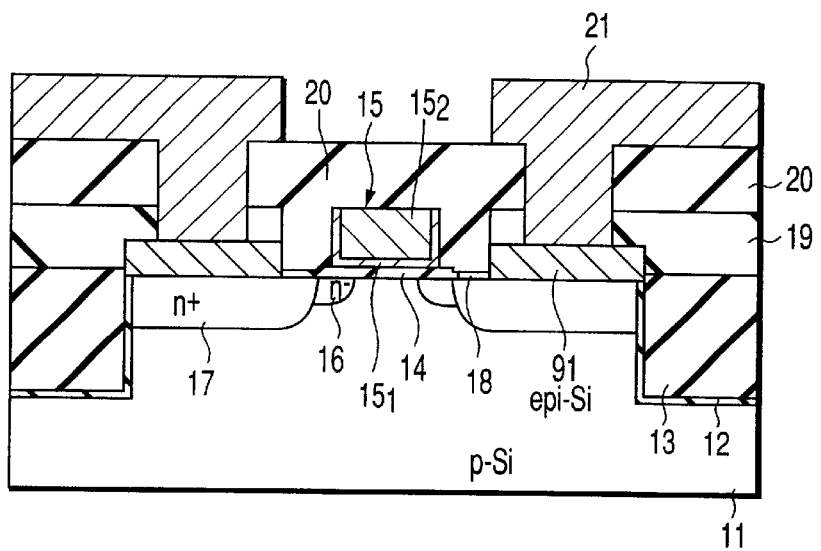
FIG. 3 is a sectional view showing the structure of a semiconductor device according to the second embodiment of the present invention.

FIG. 3 is a sectional view showing the basic sectional structure of the second embodiment. FIG. 3 is a sectional view showing the structure of a semiconductor device according to the second embodiment of the present invention. The same reference numerals as in FIG. 1 denote the same parts in FIG. 3, and a detailed description thereof will be omitted.

This device is different from the device described in the first embodiment in that an epitaxial Si layer 91 is formed on an $n^+$-type source and drain 17 to form an elevated source/drain structure. In addition, a $CoSi_2$ film (not shown) is formed on the epitaxial Si layer 91.

In an elevated source/drain structure, generally, the capacitance between the gate and the source/drain readily becomes large, adversely affecting on the element operation speed. This becomes more conspicuous when a high-dielectric constant gate insulating film is present on the side surface of the metal gate. In the second embodiment, however, since the high-dielectric constant gate insulating film between the gate and the elevated source/drain is removed, and instead, a low-dielectric constant film (e.g., a film having a dielectric constant of 2.5) is inserted therebetween, the capacitance between the gate and the source/drain is largely decreased.

Hence, the present invention exhibits a larger effect when an elevated source/drain structure is employed.

Third Embodiment

Figure 4:
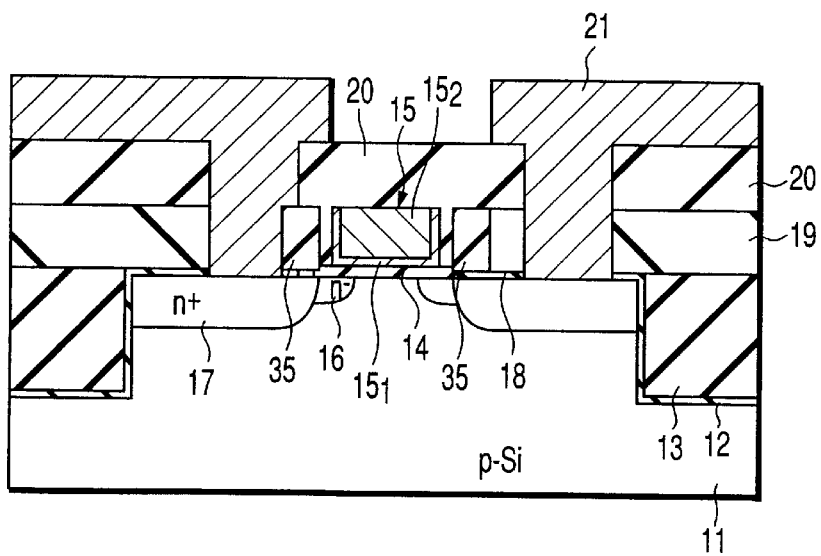
FIG. 4 is a sectional view showing the structure of a semiconductor device according to the third embodiment of the present invention.

FIG. 4 is a sectional view showing the basic sectional structure of the third embodiment. FIG. 4 is a sectional view showing the structure of a semi-conductor device according to the third embodiment of the present invention. The same reference numerals as in FIG. 1 denote the same parts in FIG. 4, and a detailed description thereof will be omitted.

This device is different from the device described in the first embodiment in that a sidewall spacer 35 is not removed. Since a $Ta_2O_5$ gate insulating film 14 on the side surface of a metal gate electrode 15 is removed, and instead, a low-dielectric constant insulating film 20 having a dielectric constant of, e.g., 2.5 is inserted, the element operation speed increases. In this embodiment, the sidewall spacer 35 is left. For this reason, even when the formation positions of contact holes connected to an $n^+$-type source and drain 17 slightly misalign, the spacer remains without being eliminated by contact RIE, and therefore, short-circuit between the contacts and the gate electrode is unlikely to occur.

As shown in FIG. 4, even when the contact hole is formed partially across the sidewall spacer 35, the gate electrode 15 and an Al interconnection 21 are kept insulated because the sidewall spacer 35 remains.

Fourth Embodiment

Figure 5:
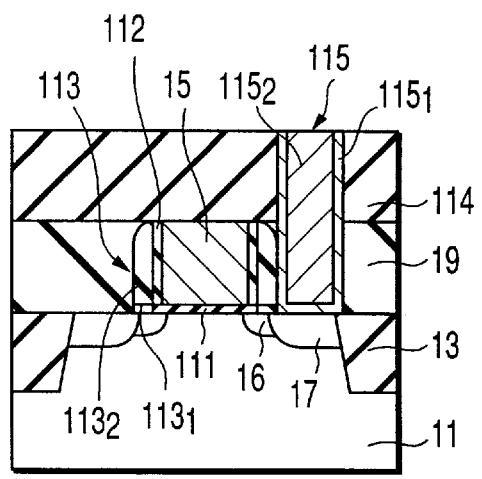
FIG. 5 is a sectional view showing the structure of a semiconductor device according to the fourth embodiment of the present invention.

FIG. 5 is a sectional view showing the basic sectional structure of the fourth embodiment. FIG. 5 is a sectional view showing the structure of a semiconductor device according to the fourth embodiment of the present invention. The same reference numerals as in FIG. 5 denote the same parts in FIG. 1, and a detailed description thereof will be omitted.

As a characteristic feature of this device, the gate insulating film on the bottom portion of a metal gate electrode 15 is formed from an epitaxially grown single-crystal $CeO_2$ film 111, and the gate insulating film on the side surface of the metal gate electrode 15 is formed from an amorphous $CeO_2$ film 112.

The dielectric constant of a $CeO_2$ film largely depends on the film quality and is as high as about 70 to 80 for a single-crystal structure. However, the dielectric constant of amorphous $CeO_2$ is about 4, i.e., almost the same as that (3.6) of a silicon oxide film.

Since a low-dielectric constant film is formed on the sidewall of the metal gate electrode 15, an increase in interconnection capacitance between adjacent gate electrode and interconnection and parasitic capacitance between the gate electrode and the contact for connecting the source/drain region to the upper interconnection layer can be suppressed.

Referring to FIG. 5, a sidewall spacer 113 formed from a silicon oxide film $113_1$ and silicon nitride film $113_2$ is formed on the side surface portion of the gate electrode 15. An interlevel insulating film 114 is formed on a TEOS-based silicon oxide film 19. A contact electrode 115 connected to an $n^+$-type source or drain 17 and formed from a titanium nitride film (barrier metal) $115_1$ and tungsten film $115_2$ is formed.

The process of manufacturing this device will be described next with reference to FIGS. 6A to 6J. FIGS. 6A to 6J are sectional views showing the steps in manufacturing the semiconductor device according to the fourth embodiment of the present invention.

Figure 6A:
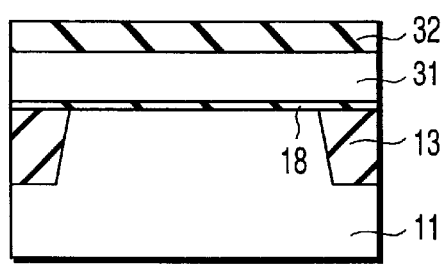
FIGS. 6A to 6J are sectional views showing the steps in manufacturing the semiconductor device according to the fourth embodiment of the present invention.

First, as shown in FIG. 6A, after an element isolation insulating film 13 and buffer oxide film 18 are formed on an Si substrate 11, a polysilicon film 31 and silicon nitride film 32 are sequentially deposited, as in the above embodiment.

Figure 6B:
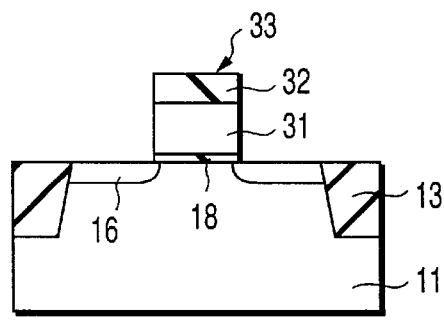

As shown in FIG. 6B, the silicon nitride film 32 and polysilicon film 31 are anisotropically etched into a desired pattern to form a disposable gate 33. Additionally, for example, As ions are implanted, and the resultant structure is annealed at 950° C. for 30 sec, thereby forming an $n^-$-type source and drain 16.

Figure 6C:
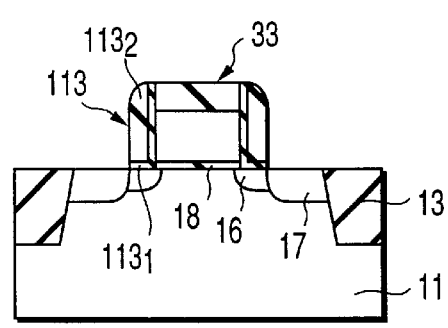

As shown in FIG. 6C, the silicon oxide film $113_1$ and silicon nitride film $113_2$ are deposited and etched to form the sidewall spacer 113 which surrounds the sidewall of the disposable gate 33 with the silicon nitride film $113_2$. Additionally, for example, $P^{30}$ ions are implanted, and the resultant structure is annealed at 850° C. for 30 sec, thereby forming an $n^+$-type source and drain 17.

Figure 6D:
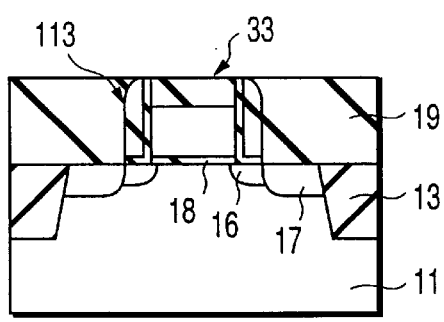

As shown in FIG. 6D, the TEOS-based silicon oxide film 19 is deposited on the entire surface and planarized by, e.g., CMP (Chemical Mechanical Polishing) until the surface of the disposable gate 33 is exposed.

Figure 6E:
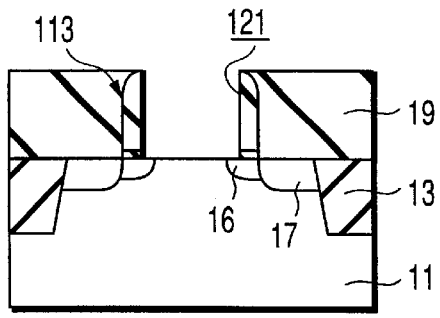

As shown in FIG. 6E, the silicon nitride film 32 and polysilicon film 31 are peeled, thereby removing the disposable gate 33. The silicon nitride film $113_2$ on the sidewall of the disposable gate 33 is not removed because of the presence of silicon oxide film $113_1$. After that, the buffer oxide film 18 and silicon oxide film $113_1$ are also peeled, thereby forming a trench portion 121 whose sidewall is formed from the silicon nitride film $113_2$ and bottom surface is formed from the Si substrate 11.

Figure 6F:
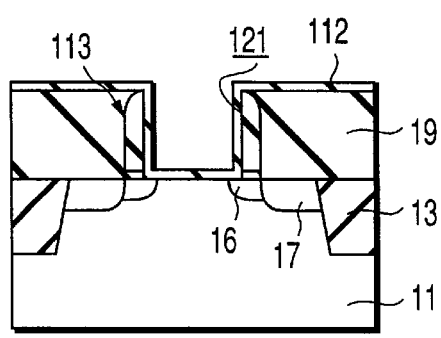

As shown in FIG. 6F, the amorphous cerium oxide ($CeO_2$) film 112 is deposited by, e.g., CVD.

Figure 6G:
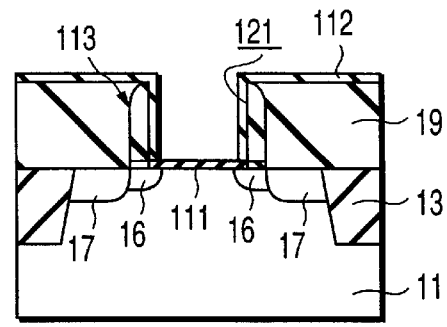

After that, as shown in FIG. 6G, the resultant structure is heated to, e.g., 450° C. to epitaxially grow a single-crystal $CeO_2$ film on the Si substrate 11 from the amorphous $CeO_2$ film 112, thereby forming the single-crystal $CeO_2$ film 111 only on the bottom surface of the trench portion 121.

The lattice constant of silicon is 5.46 Å, i.e., very close to that (5.41 Å) of $CeO_2$. That is, so-called lattice mismatching is small. For this reason, the single-crystal $CeO_2$ film 111 can be epitaxially grown on the Si substrate. However, since the amorphous $CeO_2$ film 112 is in direct contact with the Si substrate 11 only on the bottom surface of the trench portion 121, the single-crystal $CeO_2$ film 111 epitaxially grows to be self-aligned only on the bottom surface of the trench portion 121.

Figure 6H:
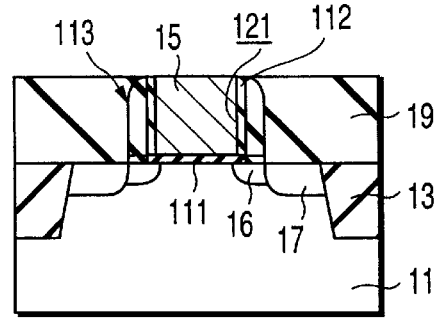

As shown in FIG. 6H, for example, a tungsten film is formed, and the tungsten film and low-dielectric constant insulating film are planarized by, e.g., CMP until the surface of the TEOS-based silicon oxide film 19 is exposed, thereby forming the gate electrode 15 buried in the trench portion 121.

With the above process, a transistor in which the sidewall of the gate electrode 15 is covered with the amorphous $CeO_2$ film 112 having a low dielectric constant, and the single-crystal $CeO_2$ film 111 having a high dielectric constant is formed on the bottom surface of the gate electrode 15 can be formed.

Figure 6I:
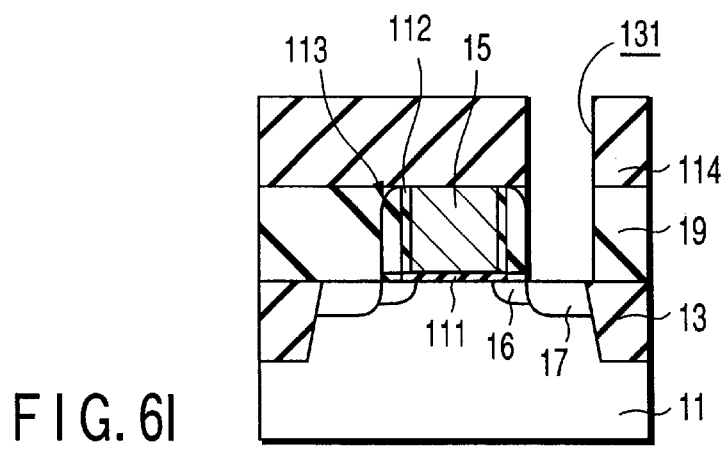
Figure 6J:
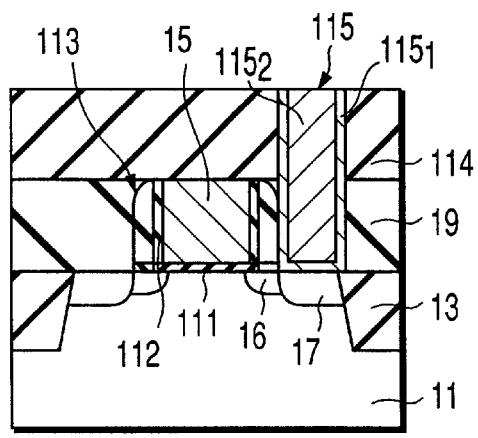

As shown in FIG. 6I, an interlevel insulating film 114 is deposited, and a contact hole 131 is formed in the interlevel insulating film 114 and TEOS-based silicon oxide film 19 on the $n^+$-type source or drain 17. After that, as shown in FIG. 6J, for example, the titanium nitride film $115_1$ and tungsten film $115_2$ are buried and planarized by CMP until the surface of the interlevel insulating film 114 is exposed, thereby forming the contact electrode 115.

Since the insulating film between the contact electrode 115 and the gate electrode 15 is the amorphous $CeO_2$ film 112 having a low dielectric constant, the parasitic capacitance between the contact and the electrode can be suppressed low, and accordingly, the processing speed of the transistor can be increased.

In this embodiment, a $CeO_2$ film is used as an insulating film to be epitaxially grown on the Si substrate. However, a zirconium oxide film ($ZrO_2$), hafnium oxide film ($HfO_2$), thorium oxide film ($ThO_2$), yttrium oxide film ($Y_2O_3$), calcium fluoride film ($CaF_2$), tin-calcium fluoride film ($CaSnF_2$), titanium-barium oxide film ($BaTiO_3$), or $La_2O_3$ may also be used.

Epitaxially growth does not always occur when lattice constants are close. For example, epitaxial growth also occurs when a lattice constant A of a deposited film and a lattice constant B of the substrate have a relationship $n_aA \approx n_bB$ ($n_a$ and $n_b$ are integers). In addition, when the lattice constant of a deposited film and that of the substrate have a predetermined relationship, epitaxial growth occurs.

In this embodiment, the $CeO_2$ film is epitaxially grown immediately after film formation, though it may be grown after formation of the metal film on the $CeO_2$ film 111 and planarization of the $CeO_2$ film and metal film. In this embodiment, the high-dielectric constant insulating film is formed by CVD, though it may be formed by sputtering or vacuum deposition.

Fifth Embodiment

Figure 7:
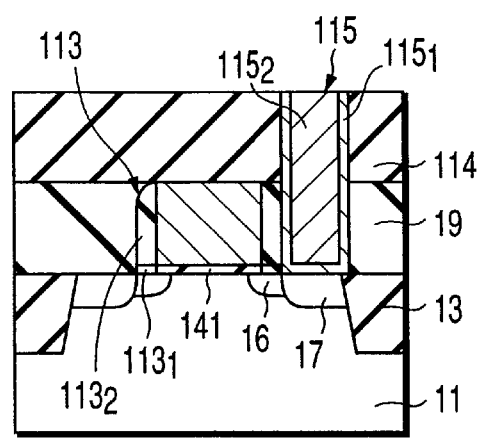
FIG. 7 is a sectional view showing the structure of a semiconductor device according to the fifth embodiment of the present invention.

FIG. 7 is a sectional view showing the basic sectional structure of the fifth embodiment. FIG. 7 is a sectional view showing the structure of a semi-conductor device according to the fifth embodiment of the present invention. The same reference numerals as in FIGS. 1 and 5 denote the same parts in FIG. 7, and a detailed description thereof will be omitted.

As a characteristic feature of this embodiment, a single-crystal $ZrO_2$ gate insulating film 141 is formed only on the bottom portion of a gate electrode 15 and not on the side surface portion of the gate electrode 15.

In this device, since the single-crystal $ZrO_2$ film having a high dielectric constant is not formed between a contact electrode 115 and the gate electrode 15, the parasitic capacitance between the contact electrode 115 and the gate electrode 15 can be suppressed low, and accordingly, the processing speed of the transistor can be increased.

The process of manufacturing this device will be described next. FIGS. 8A to 8E are sectional views showing the steps in manufacturing the semiconductor device according to the fifth embodiment of the present invention.

Figure 8A:
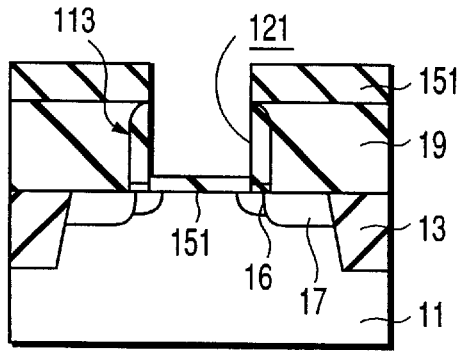
FIGS. 8A to 8E are sectional views showing the steps in manufacturing the semiconductor device according to the fifth embodiment of the present invention.

First, the same process as described with reference to FIGS. 6A to 6E of the fourth embodiment is performed. Next, as shown in FIG. 8A, an amorphous zirconium oxide film ($ZrO_2$) 151 is deposited by, e.g., anisotropic sputtering.

Figure 8B:
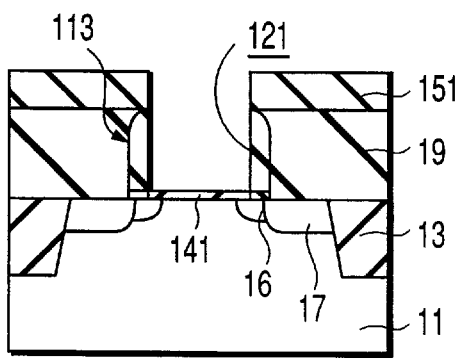

As shown in FIG. 8B, the resultant structure is heated to, e.g., 450° C. to epitaxially grow the single-crystal $ZrO_2$ film 141 on an Si substrate 11 from the amorphous $ZrO_2$ film 151. The lattice constant of silicon is 5.46 Å, i.e., very close to that (5.07 Å) of $ZrO_2$. That is, so-called lattice mismatching is small. For this reason, the single-crystal $ZrO_2$ film 141 can be epitaxially grown on the Si substrate 11. However, since the amorphous $ZrO_2$ film 151 is in direct contact with the Si substrate 11 only on the bottom surface of a trench portion 121, the single-crystal $ZrO_2$ film 141 epitaxially grows to be self-aligned only on the bottom surface of the trench portion 121.

The dielectric constant of a $ZrO_2$ film largely depends on the film quality and is as high as about 70 to 80 for a single-crystal structure. Hence, according to the present invention, a structure in which the single-crystal $ZrO_2$ film 141 having a high dielectric constant is formed only on the bottom of the trench can be formed.

Figure 8C:
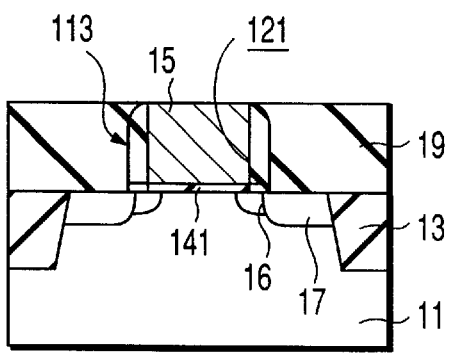

After that, as shown in FIG. 8C, for example, a tungsten film is formed in the trench portion 121, and the tungsten film and amorphous $ZrO_2$ film 151 are planarized until the surface of the TEOS-based silicon oxide film 19 is exposed, thereby forming the gate electrode 15 buried in the trench portion 121.

With the above process, a transistor in which the sidewall of the gate electrode 15 is covered with the silicon nitride film $113_2$, and the single-crystal $ZrO_2$ gate insulating film 141 having a high dielectric constant is formed on the bottom portion of the gate electrode 15 can be formed.

Figure 8D:
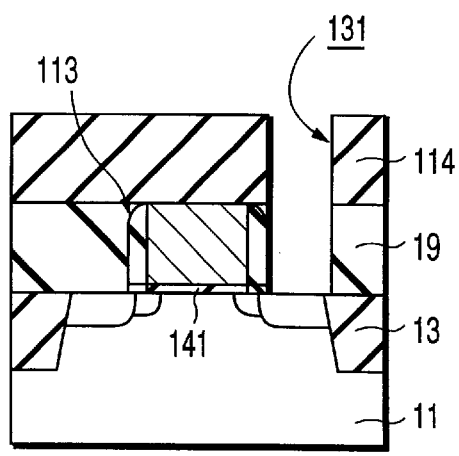
Figure 8E:
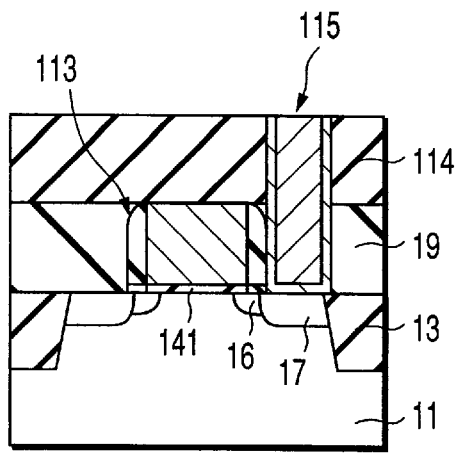

Furthermore, as shown in FIGS. 8D and 8E, the contact electrode 115 connected to an $n^+$-type source or drain 17 is buried in a contact hole 131, as in the above embodiments.

Sixth Embodiment

Figure 9:
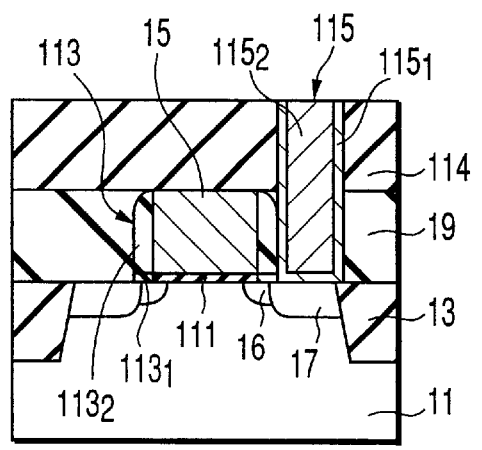
FIG. 9 is a sectional view showing the structure of a semiconductor device according to the sixth embodiment of the present invention.

FIG. 9 is a sectional view showing the basic sectional structure of the sixth embodiment. FIG. 9 is a sectional view showing the structure of a semi-conductor device according to the sixth embodiment of the present invention. The same reference numerals as in FIGS. 1 and 5 denote the same parts in FIG. 9, and a detailed description thereof will be omitted.

As a characteristic feature of this embodiment, a single-crystal $CeO_2$ film 111 is formed only on the bottom portion of a gate electrode 15 and not on the side surface portion of the gate electrode 15.

In this device, since the high-dielectric constant single-crystal $CeO_2$ film is not formed between a contact electrode 115 and the gate electrode 15, the parasitic capacitance between the contact electrode 115 and the gate electrode 15 can be suppressed low, and accordingly, the processing speed of the transistor can be increased.

The process of manufacturing this device will be described next. FIGS. 10A to 10F are sectional views showing steps in manufacturing the semiconductor device according to the sixth embodiment of the present invention.

Figure 10A:
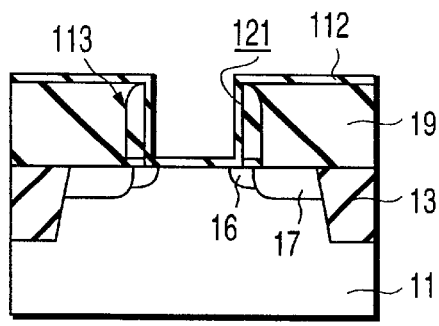
FIGS. 10A to 10F are sectional views showing the steps in manufacturing the semiconductor device according to the sixth embodiment of the present invention.

First, the same process as described with reference to FIGS. 6A to 6E of the fourth embodiment is performed. Next, as shown in FIG. 10A, an amorphous cerium oxide film ($CeO_2$) 112 is deposited by, e.g., vacuum deposition.

Figure 10B:
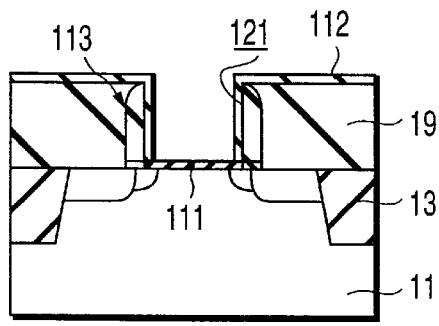

As shown in FIG. 10B, the resultant structure is heated to, e.g., 450° C. to epitaxially grow the single-crystal $CeO_2$ film 111 on an Si substrate 11 from the amorphous $CeO_2$ film 112. The lattice constant of silicon is 5.46 Å, i.e., very close to that (5.41 Å) of $CeO_2$. That is, so-called lattice mismatching is small. For this reason, the single-crystal $CeO_2$ film is epitaxially grown on the Si substrate. However, since the amorphous $CeO_2$ film 112 is in direct contact with the Si substrate 11 only on the bottom surface of a trench portion 121, the single-crystal $CeO_2$ film 111 epitaxially grows to be self-aligned only on the bottom surface of the trench portion 121.

The dielectric constant of a $CeO_2$ film largely depends on the film quality and is as high as about 70 to 80 for a single-crystal structure but as low as 4 for an amorphous structure. Hence, according to the present invention, a structure in which the single-crystal $CeO_2$ film 111 having a high dielectric constant is formed on the bottom of the trench portion 121, and the amorphous $CeO_2$ film 112 having a low dielectric constant is formed on the side surface of the trench portion 121 can be formed.

Figure 10E:
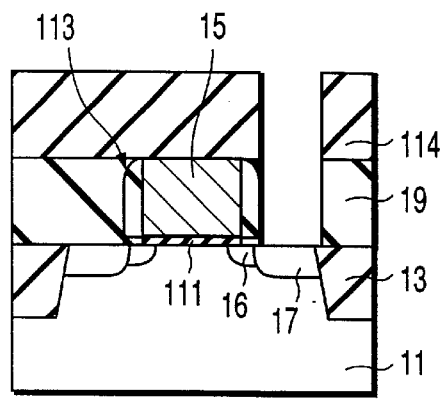
Figure 10C:
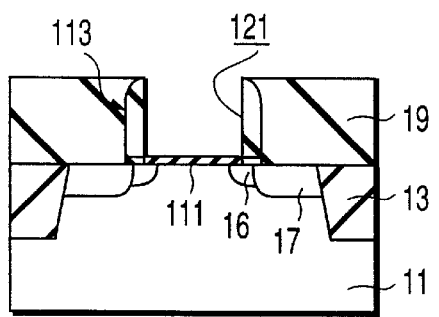

As shown in FIG. 10C, the amorphous $CeO_2$ film 112 on the side surface of the trench portion 121 is peeled using 10% diluted sulfuric acid. Since the etching selectivity ratio of the single-crystal $CeO_2$ film 111 to the amorphous $CeO_2$ film 112 is about 5 to 10, the amorphous $CeO_2$ film 112 on the side surface of the trench portion 121 can be peeled while keeping the single-crystal $CeO_2$ film 111 left on the bottom surface of the trench portion 121.

Figure 10F:
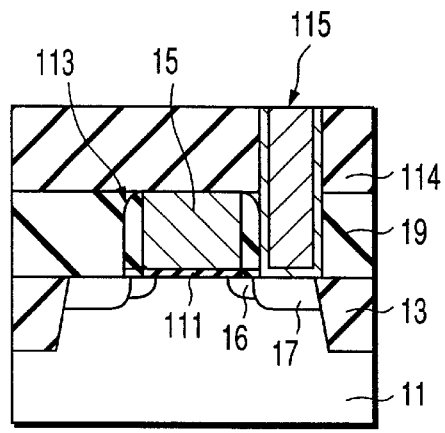
Figure 10D:
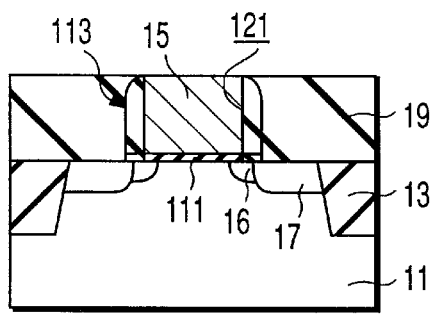

As shown in FIG. 10D, for example, a tungsten film is formed on the entire surface and planarized by, e.g., CMP until the surface of a TEOS-based silicon oxide film 19 is exposed, thereby forming the gate electrode 15 buried in the trench portion 121.

With the above process, a transistor having no high-dielectric constant insulating film on the sidewall of the gate electrode 15 and using the single-crystal $CeO_2$ film 111 having a high dielectric constant can be formed.

Furthermore, as shown in FIGS. 10E and 10F, the contact electrode 115 connected to an $n^+$-type source or drain 17 is buried in a contact hole 131, as in the above embodiments.

In this embodiment, selective etching is performed using sulfuric acid. However, hydrofluoric acid, hydrochloric acid, or nitric acid may be used.

Seventh Embodiment

Figure 11:
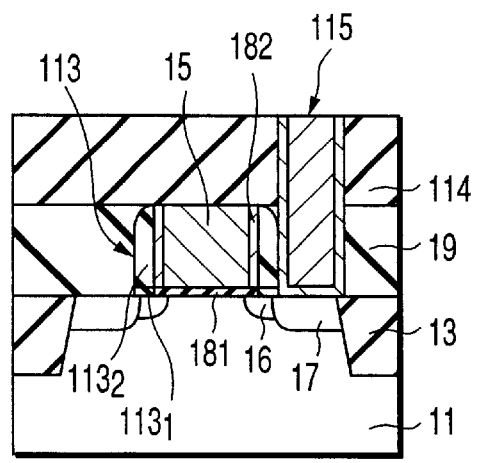
FIG. 11 is a sectional view showing the structure of a semiconductor device according to the seventh embodiment of the present invention.

FIG. 11 is a sectional view showing the basic sectional structure of the seventh embodiment. FIG. 11 is a sectional view showing the structure of a semiconductor device according to the seventh embodiment of the present invention. The same reference numerals as in FIGS. 1 and 5 denote the same parts in FIG. 11, and a detailed description thereof will be omitted.

As a characteristic feature of this embodiment, a single-crystal $HfO_2$ gate insulating film 181 is formed only on the bottom portion of a gate electrode 15 while not a single-crystal $HfO_2$ film but an HfN film 182 is formed on the side surface portion of the gate electrode 15.

In this device, since the high-dielectric constant single-crystal $HfO_2$ film is not formed between a contact electrode 115 and the gate electrode 15, the parasitic capacitance between the contact electrode 115 and the gate electrode 15 can be suppressed low, and accordingly, the procession speed of the transistor can be increased.

The process of manufacturing this device will be described next. FIGS. 12A to 12F are sectional views showing the steps in manufacturing the semiconductor device according to the seventh embodiment of the present invention.

Figure 12A:
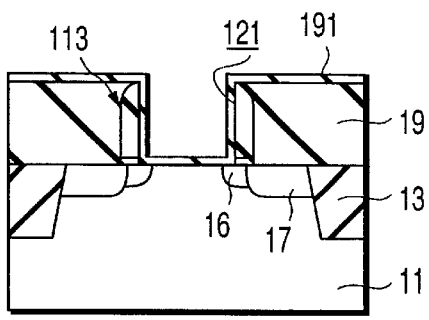
FIGS. 12A to 12F are sectional views showing the steps in manufacturing the semiconductor device according to the seventh embodiment of the present invention.

First, the same process as described with reference to FIGS. 6A to 6E of the fourth embodiment is performed. Next, as shown in FIG. 12A, an amorphous hafnium oxide film ($HfO_2$) 191 is deposited by, e.g., CVD.

Figure 12B:
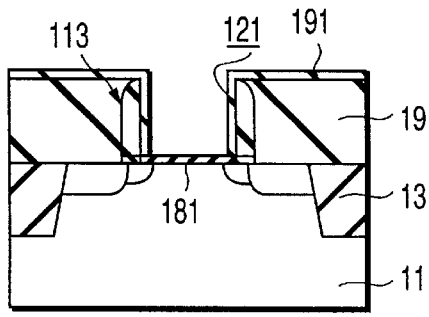

As shown in FIG. 12B, the resultant structure is heated to, e.g., 450° C. to epitaxially grow the single-crystal $HfO_2$ film 118 on an Si substrate 11 from the amorphous $HfO_2$ film 191. Since the amorphous $HfO_2$ film 191 is in direct contact with the Si substrate 11 only on the bottom surface of a trench portion 121, the single-crystal $HfO_2$ film 118 epitaxially grows to be self-aligned only on the bottom surface of the trench portion 121.

The dielectric constant of an $HfO_2$ film largely depends on the film quality and is as high as about 70 to 80 for a single-crystal structure but as low as 4 for an amorphous structure. Hence, according to the present invention, a structure in which the single-crystal $HfO_2$ film 118 having a high dielectric constant is formed on the bottom of the trench portion 121, and the amorphous $HfO_2$ film 119 having a low dielectric constant is formed on the side surface of the trench portion 121 can be formed.

Figure 12E:
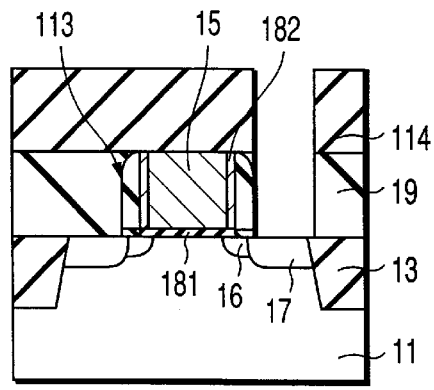
Figure 12C:
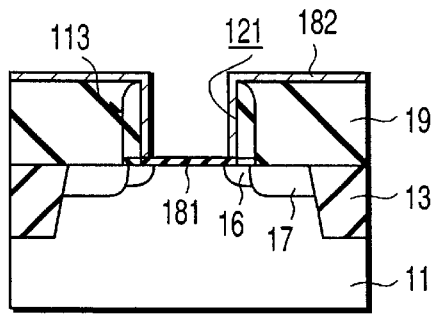

As shown in FIG. 12C, the surface of the amorphous $HfO_2$ film 191 is nitrided by heating in, e.g., an $NH_3$ atmosphere, thereby selectively forming the HfN film 182. The nitriding rate of the amorphous $HfO_2$ film 191 is higher than that of the single-crystal $HfO_2$ film 181 by about 5 times. For this reason, the single-crystal $HfO_2$ film 181 on the bottom surface of the trench portion 121 is not so largely nitrided, and the amorphous $HfO_2$ film 119 except the bottom surface of the trench portion 121 can be modified into the HfN film 182. Since the HfN film 182 is a metal film, no problem of dielectric constant is posed.

Figure 12F:
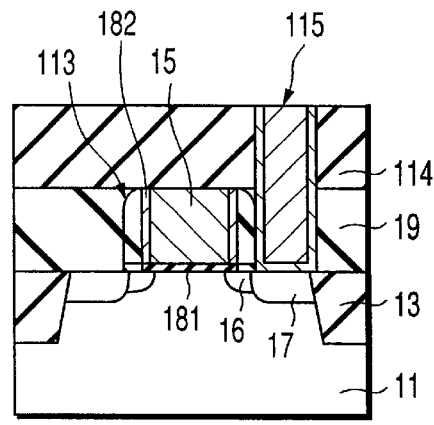
Figure 12D:
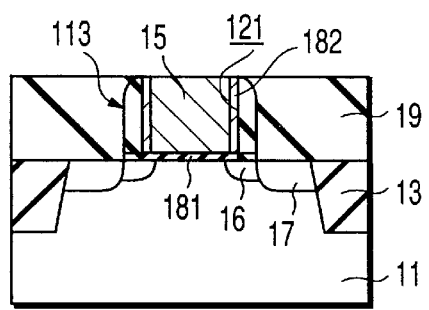

As shown in FIG. 12D, for example, a tungsten film is formed on the entire surface. The tungsten film and HfN film 182 are planarized by, e.g., CMP until the surface of a TEOS-based silicon oxide film 19 is exposed, thereby forming the gate electrode 15 buried in the trench portion 121.

With the above process, a transistor having no high-dielectric constant insulating film on the sidewall of the gate electrode and using the single-crystal $HfO_2$ film having a high dielectric constant can be formed.

Furthermore, as shown in FIGS. 12E and 12F, the contact electrode 115 connected to an $n^+$-type source or drain 17 is buried in a contact hole 131, as in the above embodiments.

In this embodiment, the HfN film is nitrided by thermal nitriding using $NH_3$. Instead, plasma nitriding may be performed. As the gas to be used for nitriding, except $NH_3$, $N_2$, $NH_4$, NO, NO2, $N_2O$, a combination thereof, or a gas mixture with a gas containing no nitrogen may be used.

The present invention is not limited to the above embodiments. For example, in the manufacturing methods described in the first to third embodiments, instead of removing the gate insulating film from the gate electrode sidewall after gate electrode formation, a gate insulating film may be epitaxially grown on the bottom portion of the gate electrode, and an amorphous insulating film may be formed on the sidewall, as in the fourth to seventh embodiments.

In addition, various changes and modifications can be made without departing from the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a disposable gate on a semiconductor substrate in a region where a gate electrode is to be formed;

forming a sidewall spacer on a sidewall of the disposable gate;

forming a source and drain in the semiconductor substrate using the disposable gate and the sidewall spacer as a mask;

forming an interlevel insulating film on the semiconductor substrate so as to cover the disposable gate;

planarizing an upper surface of said interlevel insulating film to expose upper surfaces of the disposable gate and the sidewall spacer;

removing the disposable gate to form a trench portion having a side surface formed from the sidewall spacer and a bottom surface formed from the semiconductor substrate;

depositing a gate insulating film on the semiconductor substrate so as to cover the bottom surface and side surface of the trench portion;

forming a gate electrode buried in the trench portion; and removing the sidewall spacer and said gate insulating film on the sidewall of said gate electrode.

2. A method according to claim 1, further comprising burying a low-dielectric constant insulating film having a dielectric constant lower than that of a thermal oxide film of silicon in a trench formed by removing the sidewall spacer and said gate insulating film on the sidewall of said gate electrode.

3. A method according to claim 2, wherein said low-dielectric constant insulating film is essentially formed from a material selected from the group consisting of $SiO_2$, SiOF, Fluorinated Amorphous Carbon, Parylene F, Parylene N, Polynaphthalene, Hydrogen Silsesquioxane, Spin-On-Glass, Aerogel/Xerogel, Fluorinated Polyimide, Teflon, Benzocycrobutene, Polyaryl Ether, Fluorinated Polyaryl Ether, and Air gap.

* * * * *